United States Patent
Bellorado et al.

(10) Patent No.: US 9,569,302 B1
(45) Date of Patent: Feb. 14, 2017

(54) DECODING OF TURBO PRODUCT CODES USING MISCORRECTION DETECTION

(71) Applicant: SK Hynix Inc., Gyeonggi-do (KR)

(72) Inventors: Jason Bellorado, San Jose, CA (US);
Marcus Marrow, San Jose, CA (US);
Zheng Wu, San Jose, CA (US);
Naveen Kumar, San Jose, CA (US)

(73) Assignee: SK Hynix Inc, Gyeonggi-do (KR)

( * ) Notice: Subject to any disclaimer, the term of this patent is extended or adjusted under 35 U.S.C. 154(b) by 211 days.

(21) Appl. No.: 14/288,777

(22) Filed: May 28, 2014

Related U.S. Application Data

(60) Provisional application No. 61/832,573, filed on Jun. 7, 2013.

(51) Int. Cl.
*H03M 13/00* (2006.01)
*G06F 11/10* (2006.01)
*H03M 13/15* (2006.01)
*H03M 13/29* (2006.01)

(52) U.S. Cl.
CPC .......... *G06F 11/1004* (2013.01); *H03M 13/15* (2013.01); *H03M 13/2957* (2013.01)

(58) Field of Classification Search
CPC H03M 13/152; H03M 13/2906; H03M 13/23; H03M 13/1545; H03M 13/2957; H03M 13/1525; G06F 11/076; G06F 11/00; H04L 1/0046; H04L 1/005
USPC ....... 714/776, 745, 781, 782, 792, 799, 704, 714/705, 709
See application file for complete search history.

(56) References Cited

U.S. PATENT DOCUMENTS

| 8,291,293 B2* | 10/2012 | Eroz | H03M 13/1137 714/758 |
| 2012/0254702 A1* | 10/2012 | Koganei | H04L 1/0046 714/781 |
| 2014/0089768 A1* | 3/2014 | Fujiwara | G06F 11/10 714/785 |
| 2015/0089310 A1* | 3/2015 | Motwani | G06F 11/076 714/704 |

* cited by examiner

*Primary Examiner* — Christine Tu
(74) *Attorney, Agent, or Firm* — IP & T Group LLP

(57) ABSTRACT

Decoding using miscorrection detection is disclosed. A measure indicative of the number of proposed corrections included in a set of proposed corrections corresponding to one or more of a plurality of read values is received. The plurality of read values corresponds to a codeword. It is determined whether the number of proposed corrections is a permitted number of corrections.

18 Claims, 8 Drawing Sheets

DECODING OF TURBO PRODUCT CODES USING MISCORRECTION DETECTION

CROSS REFERENCE TO OTHER APPLICATIONS

This application claims priority to U.S. Provisional Patent Application No. 61/832,573 entitled DECODING OF TURBO PRODUCT CODES USING MISCORRECTION DETECTION filed Jun. 7, 2013 which is incorporated herein by reference for all purposes.

BACKGROUND OF THE INVENTION

During decoding of error correction codes such as BCH codes, Reed-Solomon codes, and Hamming codes, a decoder will typically report a received sequence to be correctable or uncorrectable. However, miscorrection can occur when a decoder claims the received sequence to be correctable to a particular codeword, but the codeword is different from the actual transmitted codeword.

BRIEF DESCRIPTION OF THE DRAWINGS

Various embodiments of the invention are disclosed in the following detailed description and the accompanying drawings.

In some embodiments, the received sequence for which the received corrections were proposed is a portion/subset of a longer sequence of values.

Figure 5:
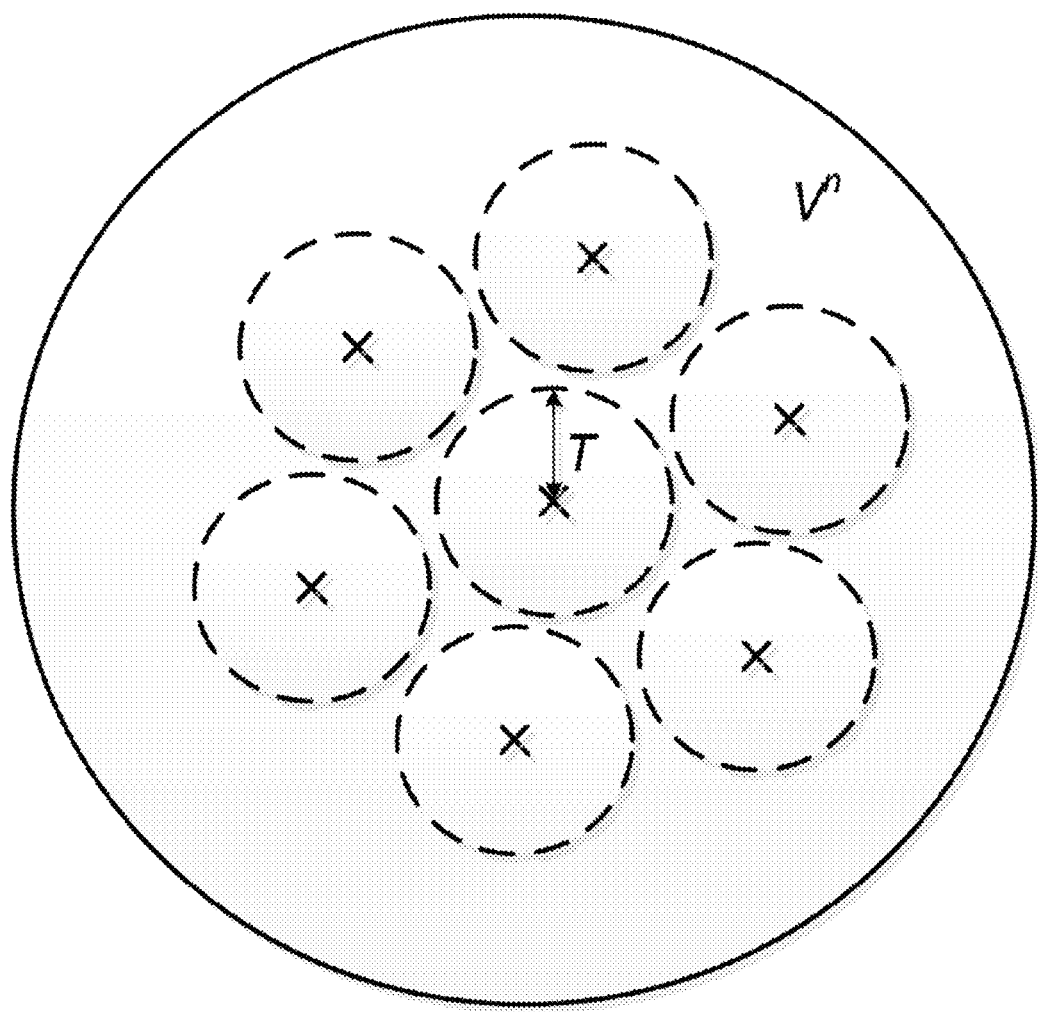

FIG. 5 is an example diagram depicting a bounded distance (T error-correcting) error-control code as spheres of radius T in n-dimensional binary space.

Figure 6:
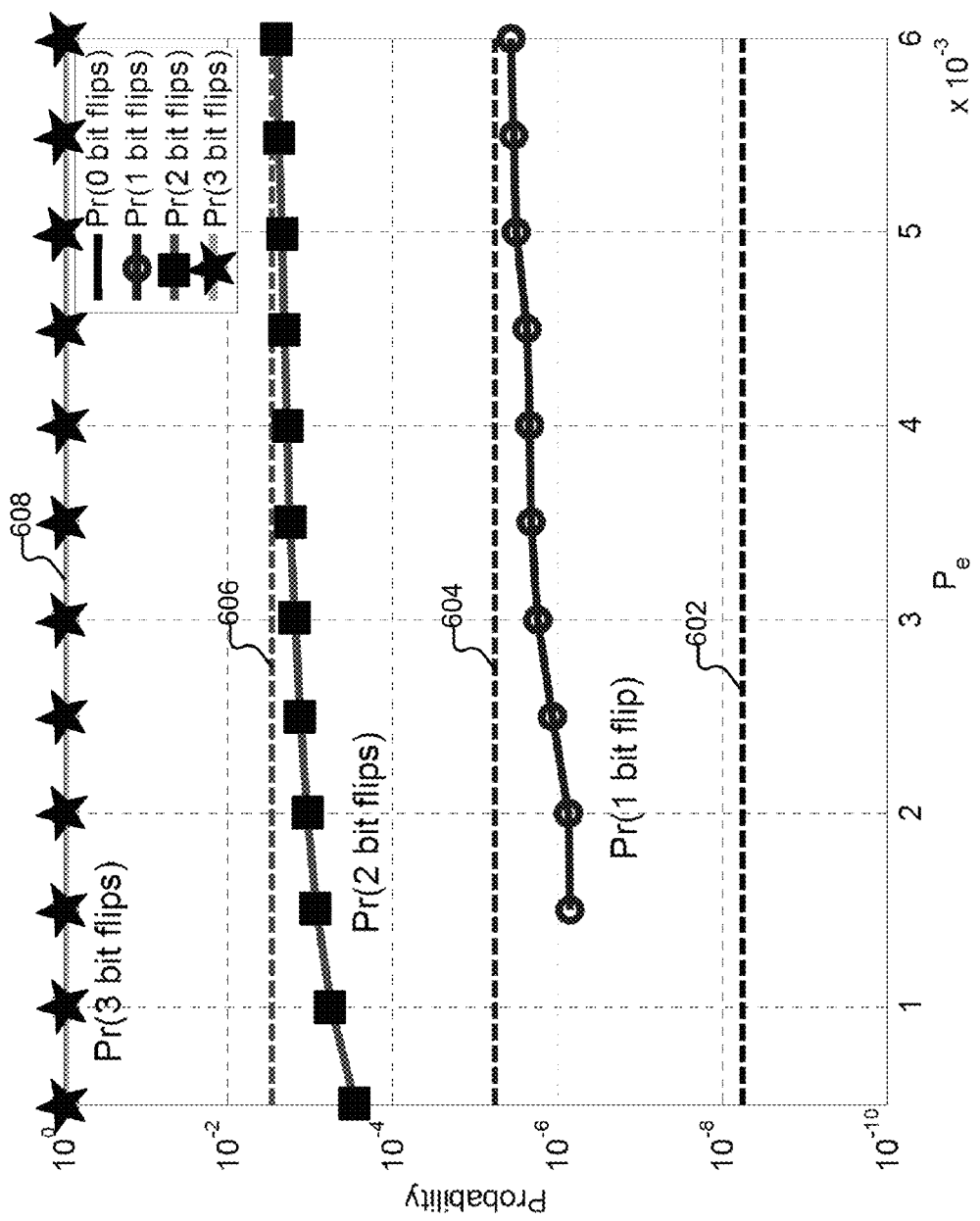

FIG. 6 is a diagram illustrating an example probability of 0, 1, 2, and 3 bits flipping a miscorrection for the (n,k,T)=(1022,992,3) BCH Code over GF ($2^{10}$).

Figure 7:
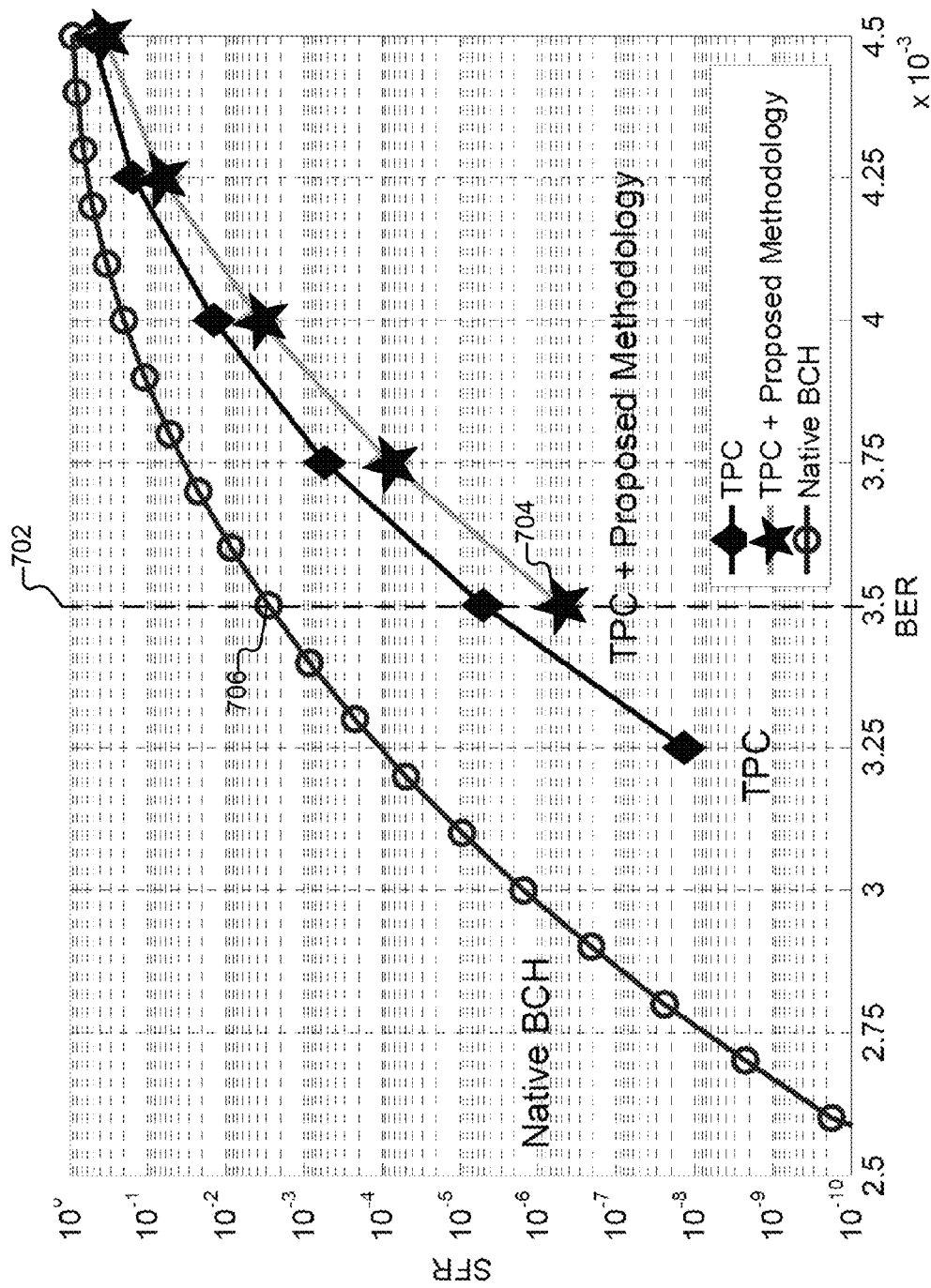

FIG. 7 is a diagram illustrating example sector failure rates (SFR) for a native 4 kB BCH Code, a TPC utilizing a (n,k,T)=(1022,992,3) constituent BCH Code over GF ($2^{10}$) utilizing a traditional decoding methodology, and the same TPC decoding using miscorrection detection.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Turbo Product Codes (TPC) can be used in NAND-based storage devices to provide improved hard-decision performance as compared to currently utilized coding methodologies such as BCH coding. As one example, a TPC is constructed by utilizing numerous (e.g., smaller and/or weaker) constituent codes, where each bit is protected by several of these codes. The corresponding decoding architecture is iterative in that decoding is performed in rounds, where each round consists of a decoding attempt by all constituent codes. As the decoding procedure continues, successful decoding attempts by the constituent codes will remove bit-errors from the received sequence, thus increasing the likelihood of success in decoding the next round. Decoding success can be declared when the constraints of all codes are satisfied.

The constituent codes utilized to compose a TPC can have a significant impact on its achievable performance. In some instances, high error-correcting performance is achievable using constituent codes which are short and extremely weak (e.g., using a multitude of 3-bit error correcting (T=3) BCH Codes of length ~1000 bits). The utilization of short and/or weak codes, however, can be difficult due to their tendency to miscorrect (i.e., decode to a codeword other than the one that was originally written) when greater than T bit-errors occur.

An example of the performance of such a constituent code (a length—1023, 3-bit error-correcting (T=3) BCH Code over GF ($2^{10}$)) is shown in conjunction with FIGS. 1A and 1B, described in more detail below.

Figure 1A:
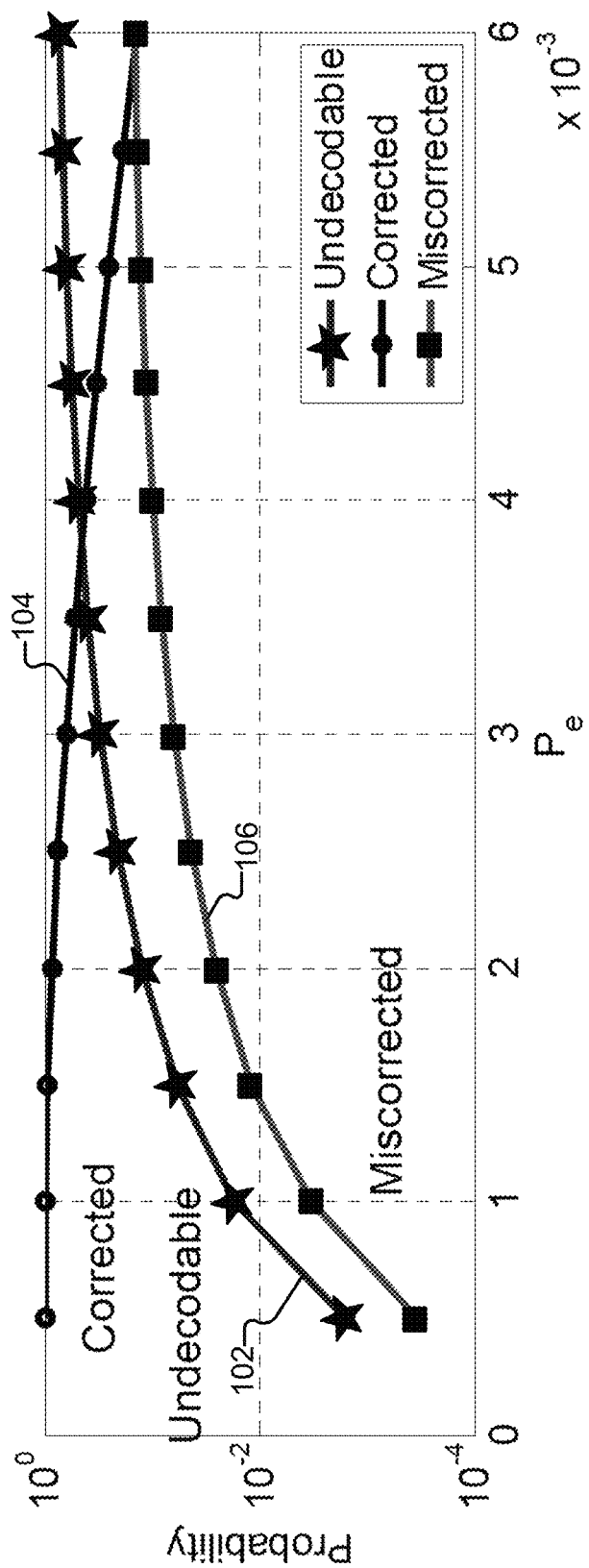
FIG. 1A is an example diagram demonstrating the probability of decoding attempts that are undecodable, correctable, and miscorrection.

FIG. 1A is an example diagram demonstrating the probability of decoding attempts that are undecodable, correctable, and miscorrection. As TPC decoding proceeds, a decoding attempt for each constituent code is made. As such, there are three possibilities, the probabilities of which are displayed for the example constituent code:

1) Undecodable (102): The constituent code is unable to decode and, therefore, no bits will be flipped in the received sequence. In this example, a 3-bit error-correcting BCH code is used. However, if a received sequence requires more than 3 bit-flips to reach a known codeword, then the received sequence is determined to be undecodable.

2) Corrected (104): The constituent code is able to decode, and the resultant codeword is equivalent to that which was written.

3) Miscorrected (106): The constituent code is able to decode, however, the resultant codeword is NOT equivalent to that which was written (i.e., a false positive has occurred).

The case 2) (i.e., corrected) will act to remove bit-errors from the received sequence, whereas case 3) will act to insert bit-errors into the received sequence.

Figure 1B:
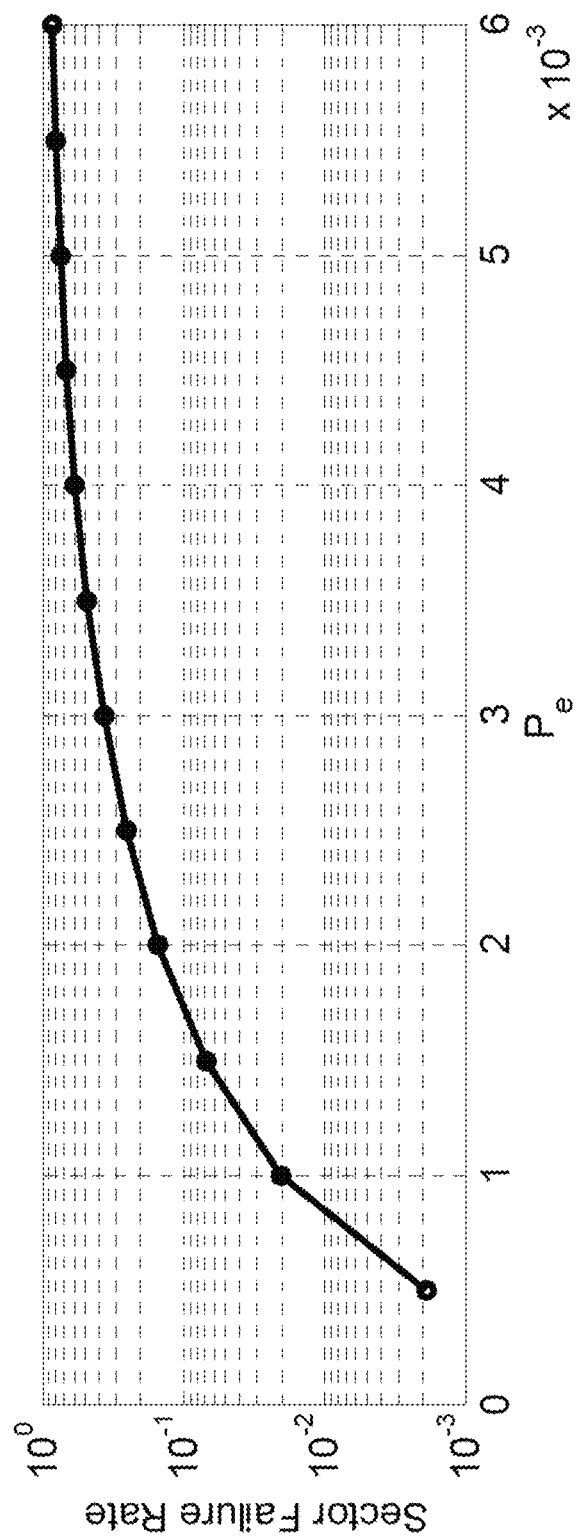
FIG. 1B is an example diagram demonstrating sector failure rates (SFR).

FIG. 1B is an example diagram demonstrating sector failure rates (SFR). As shown, an SFR of ~1e-3 can be achieved with an input bit error rate (BER) ($p_e$) of ~5e-4 and, at this bit-error rate, the probability of miscorrection (shown in FIG. 1B) is relatively low. When this code is used in a TPC structure, however, better SFR performance can be achieved. For example, an SFR of 1 e-3 can be achieved by a TPC employing such a constituent code at a BER of ~4e-3, however, the probability of miscorrection at this BER is ~6e-2 (i.e., it is non-negligible). As the BER approaches 6e-3, a received sequence which is able to be decoded has an equal probability of correction and miscorrection. Performance of a TPC using constituent codes is further described in conjunction with FIG. 7.

In a TPC structure, miscorrection can present a significant issue, as miscorrection will act to inject more bit-errors into the received sequence. Thus, future rounds of decoding will be less likely to succeed when miscorrections occur. Described herein are techniques which can be utilized to reduce the probability of miscorrection, thereby improving overall decoding system performance. For example, using the techniques described herein, corrected and miscorrected decoding attempts can be distinguished, thereby reducing the number of miscorrected bits.

Decoding Using Miscorrection Detection

Figure 2:
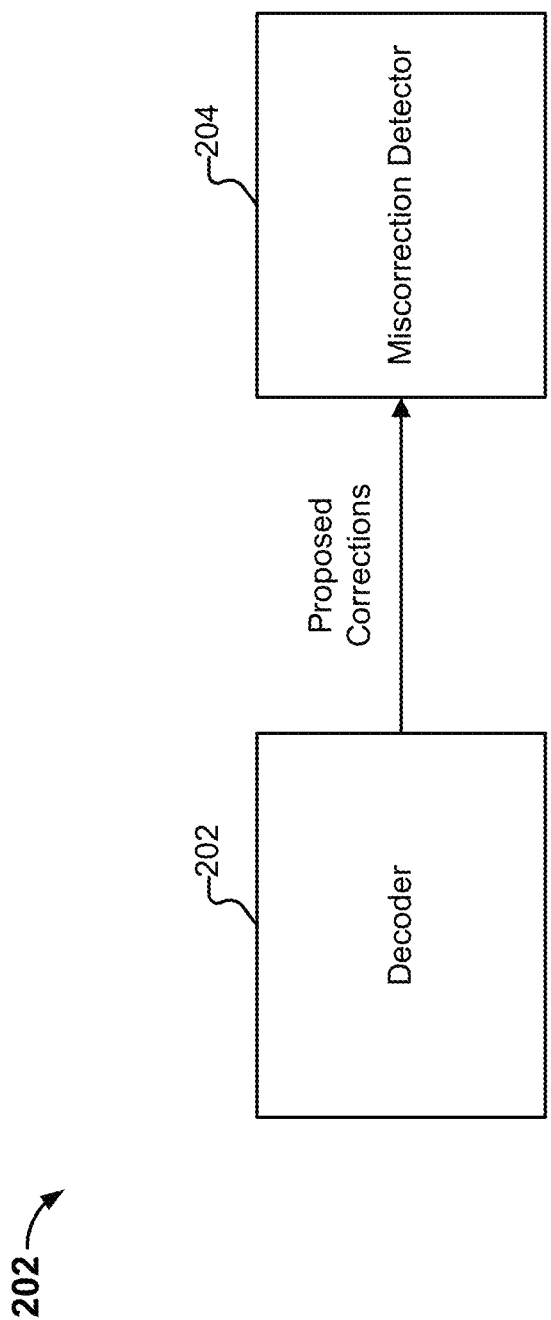
FIG. 2 is a block diagram illustrating an embodiment of a system for decoding of turbo product codes using miscorrection detection.

FIG. 2 is a block diagram illustrating an embodiment of a system for decoding of turbo product codes using miscorrection detection. In this example, system 200 includes decoder 202 and miscorrection detector 204. In some embodiments, decoder 202 and miscorrection detector 204 are components of a data receiver/decoder (e.g., TPC decoder) that is configured to decode received data transmitted over a channel (e.g., read channel of a NAND-based storage) that was previously encoded using an encoder (e.g., TPC encoding). In some embodiments, decoder 202 is configured to decode constituent codes used in a TPC. In some embodiments, system 200 and its components comprise one or more semiconductor device(s) or chip(s) (e.g., an ASIC or an FPGA). In some embodiments, the miscorrection detector is an integrated component of the decoder. In some embodiments, the miscorrection detector is a post-processor that is implemented to augment/enhance the functionality of the decoder (e.g., to reduce the probability of error when decoding).

In some embodiments, decoder 202 is an error correction decoder that is configured to decode received sequences (e.g., stored data that was previously encoded and transmitted over a read channel), including correcting errors in received sequences. Decoding a received sequence can include determining a set of proposed corrections to apply to a received sequence of data values.

In some embodiments, decoder 202 is configured to decode constituent codewords (e.g., BCH constituent codewords) of a TPC. In some embodiments, decoder 202 is a TPC decoder that includes a sub-decoder configured to decode constituent codes utilized in a TPC (e.g., BCH constituent codes). As described above, a TPC can be composed of a plurality of constituent codes, where the decoding architecture that is utilized to decode the TPC is an iterative process in which decoding is performed in rounds, and where each round consists of a decoding attempt by all constituent codes. As the decoding procedure continues, successful decoding attempts by the constituent codes will remove bit-errors from the received sequence to be decoded. In some embodiments, the decoder, for a received set of values (e.g., bits that represent a constituent codeword), determines the closest known codeword (which may be included in a codebook) to the received set of values In a TPC example scenario, the constituent codes forming the TPC can be BCH codes (e.g., 3-bit error correcting (T=3) BCH codes of length ~1000 bits). As part of TPC detection, the decoder can be configured to decode each constituent code of the TPC, where decoding includes determining potential locations of errors in the received sequence associated with a code and/or a set of proposed corrections (e.g., if the received sequence associated with a constituent code is not a codeword). In some embodiments, the proposed corrections are a set of proposed bit flips (and their corresponding locations) that if applied, would result in potential errors in the received constituent code being fixed and a known codeword (e.g., belonging to a pre-determined codebook) being produced (i.e., correcting any errors that may have occurred during reading of data from storage that may potentially cause bits in the constituent code to become erroneously flipped).

In some embodiments, the proposed corrections to a code (or codes) such as a constituent code of a TPC are sent to miscorrection detector 204, which is configured to determine whether the proposed corrections should be applied. For example, although the decoder is configured to propose a set of corrections that, if applied, would produce a known codeword, there is a possibility that miscorrection may occur. Miscorrection detector 204 is configured to reduce the likelihood of miscorrection occurring.

In some embodiments, miscorrection detector 204 is configured to determine, based on an evaluation of the proposed bit flips (e.g., proposed corrections determined by the error detection engine), whether to permit the proposed bit flips to be applied (or prevent the proposed bit flips from being applied). In some embodiments, the determination of whether to permit application of the proposed corrections includes determining the number of bit flips proposed, and determining whether the number of proposed corrections is a permissible number of bit flips. If the number of proposed bit flips is permitted, then, in some embodiments, the miscorrection detector sends an indication (e.g., to decoder 202) to apply the proposed bit flips. In some embodiments, decoder 202 is configured to apply the proposed corrections upon receiving an indication from the miscorrection detector that the proposed corrections are approved.

As one example, if the constituent codes to be decoded by the decoder are BCH codes where up to T=3 bit errors can be potentially corrected, the miscorrection detector can be configured to permit only making corrections to codewords that correct while flipping <T bits. In a TPC decoding scenario, as every bit in a TPC is involved in multiple constituent codes, removing a bit-error from the received sequence acts to remove an error from every code in which that bit is involved (conversely, adding a bit-error (e.g., due to miscorrection) into the received sequence acts to add an error into every code in which that bit is involved). Several decoding rounds may then proceed in this manner before reaching a state in which all constituent codes require T bit-flips to make a correction. Such a correction can then be made (i.e., after all <T bit-flips are first performed).

In some embodiments, scheduling of the application of bit-flips/correction to received sequences is performed based on decoding criteria. The decoding criteria can include the number of bit-flips proposed for received sequences (e.g., associated with constituent codes that are potentially codewords). For example, a decoding procedure can begin by only making corrections that require a single bit-flip (as they are the least likely correction of adding bit-errors into the received sequence, as will be described in more detail below), and then proceeding onwards to a greater number (e.g., incremental increase) of flips when these are exhausted. In some embodiments, for a set of constituent codewords that can be attempted to be decoded in parallel/simultaneously, all codewords that of a particular number of bit-flips are performed in a first round, and when those codewords requiring the particular number of bit-flips are exhausted, codewords that require a larger number of bit-flips can then be addressed.

In some embodiments, the scheduling of decoding of the various constituent codewords used in a TPC is governed by the number of bit-flips proposed for each of the codewords. For example, in some embodiments, in each round, the attempts to decode codewords can be prioritized based on the corresponding required number of bit-flips for each of the codewords to be decoded in that round. For example, decoding can begin from the constituent codewords that are identified to require the lowest number of bit-flips, increasing as codewords at a particular number of bit-flips are processed and exhausted (while still being subject to decoding criteria such as only permitting <T bit-flips).

In other embodiments, all corrections that require a permissible number (or according to any other appropriate decoding criteria) of bit flips (e.g., in a permissible range such as <T bit-flips) can be made simultaneously. For example the probability of miscorrection may be low enough such that the decoding performance is not degraded. An example analysis of the performance achievable using the decoding procedure described will be described in more detail below.

Figure 3:
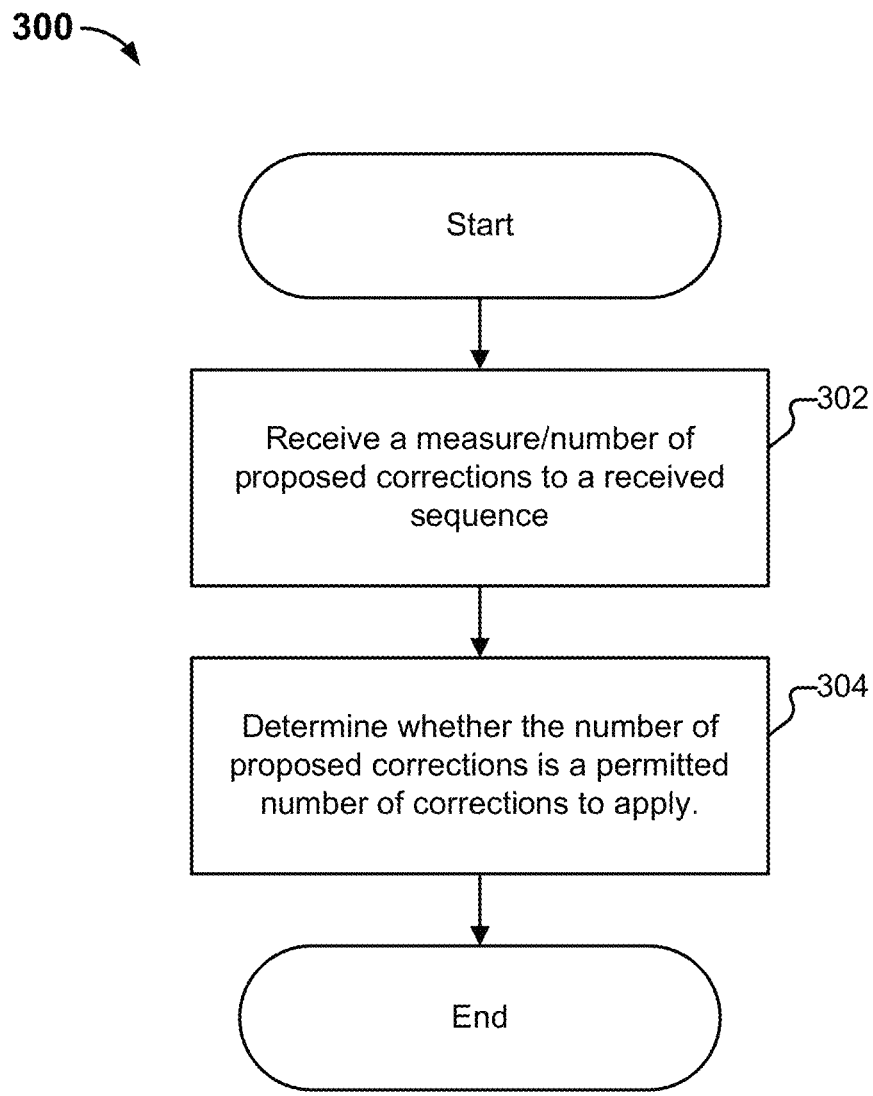
FIG. 3 is a flow diagram illustrating an embodiment of a process for decoding of turbo product codes using miscorrection detection.

FIG. 3 is a flow diagram illustrating an embodiment of a process for decoding using miscorrection detection. In some embodiments, process 300 is executed by system 200 of FIG. 2. The process begins at 302, when a measure of proposed corrections to apply to a received sequence is received. In some embodiments, the proposed corrections are generated by a decoder (such as decoder 202 of FIG. 2) to apply to a received sequence of values (e.g., read values corresponding to a codeword).

In some embodiments, the received sequence to be evaluated is a portion/subset of a code, such as a constituent BCH code used in a Turbo Product Code (TPC). In some embodiments, measures of proposed corrections corresponding to a plurality of received sequences (e.g., constituent codes) are received. In some embodiments, the measure is a proposed number of corrections to be applied to a sequence to be decoded. For example, suppose that a received sequence of bits is passed through a decoder. The decoder can determine the nearest known codeword (e.g., previously determined/configured and included in a codebook) to the received sequence of bits, where the decoder can also identify the locations of bits in the received sequence that are different from the nearest codeword. The decoder is configured to in turn propose bit-flips at the identified locations in order to correct the received sequence.

At 304, it is determined whether the proposed number of bit-flips is a permitted/non-permitted/prohibited number of bit-flips. As described above, miscorrection can occur, for example, when a large number of errors have occurred (e.g., during transmission of the received and encoded sequence) such that the nearest codeword to which the decoder believes the received sequence can be corrected is in actuality a different codeword from the original codeword that was transmitted.

In some embodiments the permitted number of bit-flips is included in a set of decoding criteria used to determine whether proposed corrections should be applied to potentially correct a received sequence (that is associated with a codeword). In some embodiments, the permitted number of bit-flips is relative to the error correction capability of an encoding scheme used to encode the data that is to be decoded. For example, if the error-correcting code is capable of correcting up to (and including) T=3 bit-errors (e.g., for a BCH constituent code), then the permitted number of bit-flips that can be applied may be any number of bit-flips that is less than T=3 (i.e., 0, 1, and 2 bit-flips are allowed/not prohibited). Restricting/limiting the number of bit-flips that are permitted to be applied (when attempting to correct received sequences) can aid in reducing the probability of miscorrection, as will be described in more detail below.

The maximum permitted number of bit-flips can be used as a threshold when determining whether the proposed bit-flips should be applied. Any number of proposed bit-flips that is less than the maximum error-correcting capability can be used as a threshold. For example, even if the error-correcting capability of the decoder that is attempting to decode a received sequence is T=3, the maximum number of bits that can be allowed to be applied can be configured to be only 1-bit, with bit-flips of 2 or more being prohibited.

In some embodiments, the permitted number of bit-flips can be dynamically changed throughout the decoding process. For example, in an iterative decoding process such as TPC decoding, where constituent codes are decoded, the number of permitted bit-flips can be adjusted depending on the current state/stage/round of the decoding process, as well as the status of the processing of the constituent codes. As an example, only corrections to codewords that correct (according to the decoder) while flipping <T bits can be permitted to flip. However, after several decoding rounds, a state may be reached in which all remaining constituent codes to be decoded require T bit-flips to perform a correction. When the decoding process reaches such a state, all proposed bit-flips of the number T (i.e., maximum correcting capability of the decoder) can be permitted. In some embodiments, the state of the decoding process is included in a set of decoding criteria for determining scheduling of decoding and/or the permitted number of bit-flips to allow to be applied).

In some embodiments, the permitted number of bit-flips is adjusted progressively based on the state of the remaining constituent codes. For example, in an example TPC decoding process, the procedure can start by only making corrections proposed by the decoder that require a single bit-flip (as they are the least likely correction of adding bit-errors into a received sequence), and then proceeding onwards to a greater/increasing number of flips when proposals of lower numbers of bit-flips are exhausted. In some embodiments, the probability of miscorrection is low enough such that all corrections requiring <T bit-flips can be made simultaneously without degrading decoding performance. Other schedules for applying proposed bit-flips when decoding codewords can also be implemented.

An example of TPC decoding using a scheme/procedure for reducing the probability of miscorrection as described above will be described below in conjunction with FIG. 4.

Decoding of Turbo Product Codes Using Miscorrection Detection Example

The following is an example decoding procedure for decoding a Turbo Product Code (TPC), where each bit in the TPC is involved in multiple constituent codes. In such a scenario, removing a bit-error from a received constituent code acts to remove an error from every code in which that bit is involved (conversely, adding a bit-error into the received sequence acts to add an error into every code in which that bit is involved). As described above, decoding of a TPC is performed iteratively, over multiple decoding rounds, in which each round consists of a decoding attempt by all constituent codes. As the decoding procedure continues, successful decoding attempts by the constituent codes will remove bit-errors from the received sequence, thus increasing the probability/likelihood of successful decoding in subsequent rounds. In some embodiments, the decoding process (and decoding criteria) described below can be used to configure the scheduling of decoding of received sequences, such as received sequences that are associated with the multiple constituent codes that are elements of a TPC, in order to reduce the probability/likelihood of miscorrection.

Figure 4:
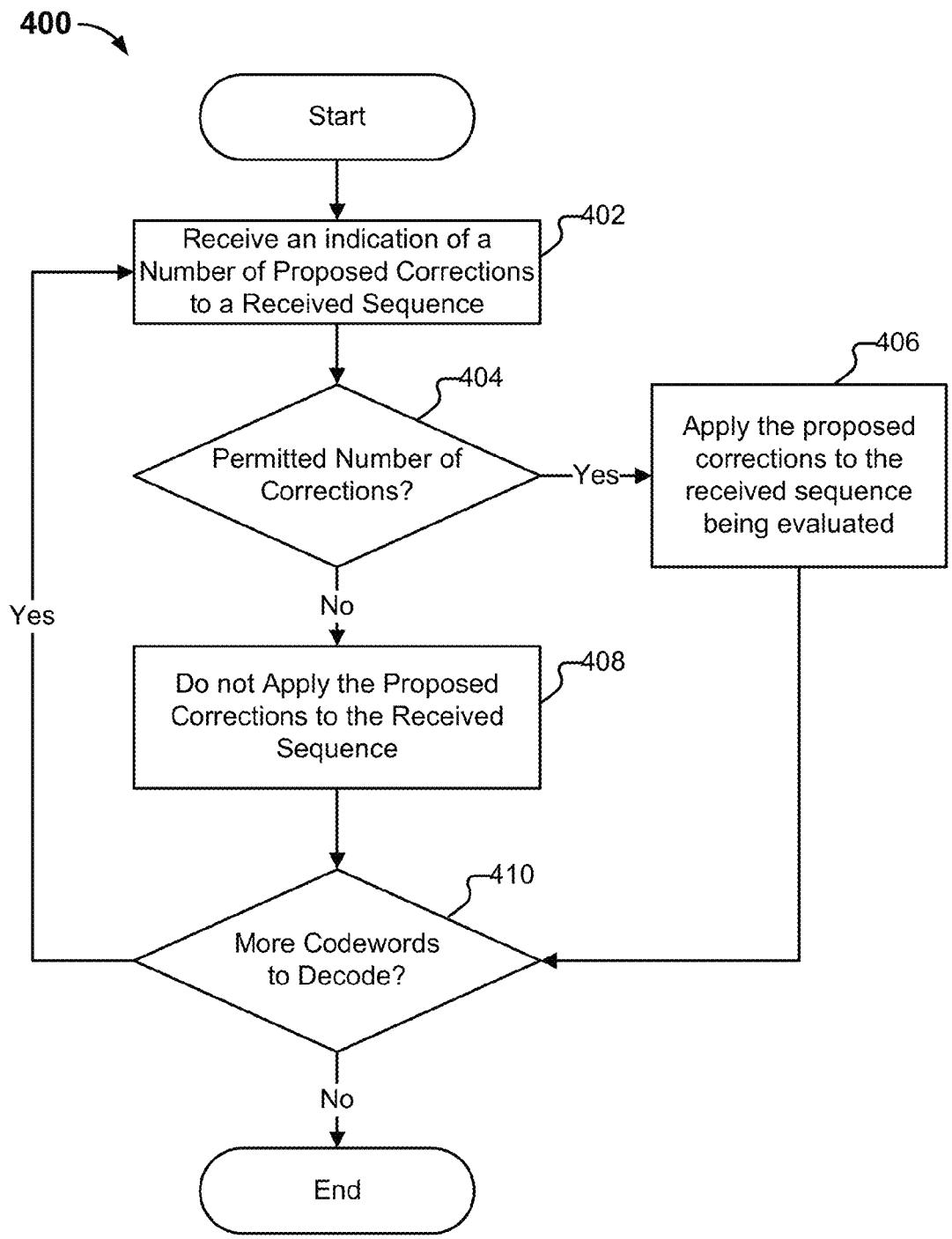

FIG. 4 is a flow diagram illustrating an embodiment of a process for decoding of turbo product codes using miscorrection detection. In some embodiments, process 400 is executed by system 200 of FIG. 2. The process begins at 402 when proposed corrections to apply to a received sequence are received. In some embodiments, the proposed corrections are generated by a decoder (such as decoder 202 of FIG. 2) to apply to a received sequence of values (e.g., read values corresponding to a codeword).

In some embodiments, the received sequence for which the received corrections were proposed is a portion/subset of a longer sequence of values. As one example, a constituent BCH code of a Turbo Product Code (TPC) can be received. In some embodiments, proposed corrections for a plurality of codes can be received (e.g., to perform batch/simultaneous/parallel evaluation of constituent codes). In some embodiments, a number/measure indicative of a number of corrections are received. In some embodiments, a set of proposed locations to correct in a sequence are received, and the number of proposed locations to be flipped is identified/determined.

At 404, it is determined whether the proposed number of corrections to apply to a received sequence is a permitted number of corrections (or is not a prohibited number of corrections). In some embodiments, the permitted number of corrections are included in a set of decoding criteria used to determine whether proposed corrections should be applied to potentially correct a received sequence (that may be associated with a constituent code that is potentially a codeword). In some embodiments, the decoding criteria can include a particular state/condition of the decoding process, that if met, causes an adjustment of the permitted number of bit-flips, as will be described in more detail below.

In the event that the proposed number of corrections is a permitted number of corrections, control is transferred to 406. Otherwise, in the event that the proposed number of corrections is not a permitted number of corrections, control is transferred to 408. In some embodiments, the receipt of proposed corrections and the determination of whether the proposed corrections are permissible is determined based at least in part on using a process such as process 300 of FIG. 3. In some embodiments, the permitted number of corrections is relative to the error-correcting capability of the decoding scheme that is attempting to correct the received sequence (e.g., that is associated with a constituent code that is potentially a codeword). In some embodiments, to reduce the likelihood of miscorrection, the maximum permitted number of bit-flips for a given round is less than the maximum error-correcting capability of a decoder. For example, if the decoder proposing the corrections is capable of correcting up to T bit-errors, then the maximum number of permitted bit-flips can be configured to be less than T (not inclusive). In some embodiments, a stuck condition may be reached in the event that the only remaining constituent codewords to be decoded that are correctable require T bit-flips. In this scenario, based on the decoding criteria (number of permitted corrections), a stuck condition has been met. In this case, T bit-flips can now become permitted, and an additional iteration/round of decoding is performed.

At 406, the proposed corrections are applied to the received sequence (e.g., constituent code) that is being evaluated. The corrected codeword that is a result of applying the proposed corrections to the received sequence of values is then obtained and can be outputted. As described previously, by limiting/controlling the number of bit-flips that are permitted in the various rounds of an iterative decoding procedure, the probability of miscorrection can be reduced. Additionally, removing bit-errors from the received sequence can allow for further decoding rounds to be more likely to succeed.

At 408, the proposed corrections are not applied to the received sequence. In some embodiments, if the proposed corrections are not a permitted number of corrections, the proposed corrections are not applied (e.g., the decoder does not attempt to correct a constituent code being evaluated). Although the proposed corrections are not applied to a received sequence such as a particular constituent code of a TPC in a current round, a subsequent attempt at decoding the codeword can be performed again in a subsequent round of decoding. As the decoding process is iterative, and a single bit may be encoded by multiple constituent codewords, corrections applied in a first round to a first codeword that resulted in removal of a particular bit-error will result in the bit-error being removed from a second codeword that had been used to encode the particular bit-error location. Thus, in a subsequent round of decoding involving the second codeword, the number of bit-flips required to correct the second codeword is reduced. As proposed corrections for codewords may potentially be reduced from a previous round, a constituent codeword that was previously not permitted to be corrected (e.g., uncorrectable, or exceeded a permitted number of bit-flips) may become correctable in a subsequent round (e.g., become correctable by a number of bit-flips that is within the permitted range of corrections).

At 410, it is determined whether there is at least one more codeword to decode. In the event that there is at least one more codeword to decode, control is returned to 402, where it is determined whether proposed corrections for a subsequent/next codeword should be applied. Otherwise, in the event that there are no more codewords to decode, process 400 ends. In some embodiments, whether process 400 ends also depends on whether a set of decoding criteria have been satisfied. As one example, a decoding criteria can be specified indicating that if there are no more remaining codewords that are within the error correcting capability of the decoder, then the process ends. For example, if there are remaining constituent codewords that have not been decoded, but a stuck condition/state has been reached in which the remaining codewords would require >T bit-flips, an alternative decoding scheme can be used to attempt to successfully decode any remaining codewords.

In some embodiments, for an iterative decoding scheme such as that used for decoding a TPC, the permitted number of corrections is adjusted depending on the state of the codewords to be decoded. As one example embodiment of a decoding procedure, suppose that a TPC with BCH codes of T=3 is to be decoded (the procedure can be extended to any T). The decoding procedure starts by only making corrections that require a single bit-flip, as they are the least likely correction of adding bit-errors into the received sequence, and then proceeding onwards to a greater/increasing number of bit-flips when the lower number of bit-flips are exhausted (e.g., there are no more constituent codewords correctable at the previous, lower number of proposed bit-flips). For example, in some embodiments, an indication is received of whether there are any constituent codewords that are correctable at the current permitted number of corrections. If there are no more constituent codewords that are correctable at the current number of permitted corrections, than the permitted number of corrections is increased. The permitted number of corrections can increase, for example, until the maximum correction capability of the decoder is reached (e.g., T).

In some embodiments, the permitted number of corrections and their adjustment (and the scheduling of decoding) is based on an analysis of the probability/likelihood of miscorrection, as will be described in more detail below.

In some cases, the probability of miscorrection is at a low enough level for all corrections requiring <T bit-flips that all such correction can be made simultaneously without degrading performance. For example, if each bit in a TPC is protected along two dimensions of constituent codes (with each bit capable of being protected by multiple constituent codes), forming a matrix of constituent row codes and constituent column codes, all constituent codes in one axis that require <T bit flips can be performed simultaneously and in parallel. If the corrections are successful, for example, when decoding the constituent row codes, the number of bit-errors for the constituent codes along the column dimension are potentially reduced. This may allow previously uncorrectable constituent codes to become correctable. In the example embodiments above, the decoding process is rescheduled such that the more reliable decoding of constituent codewords is performed first (e.g., the decoding of codewords that require a lower number of bit-flips and have a corresponding lower probability of miscorrection). As the more reliable codewords are decoded first, the less reliable codewords can be decoded in later rounds (where the codewords may become more reliable as bit-errors are removed in earlier rounds), resulting in a reduced probability of miscorrection. Other decoding schedules can utilized.

Turbo Product Code Miscorrection Analysis

For a code of length-n and dimension-k, the probability of obtaining m bit-errors is given by the binomial distribution as, $$Pr(m \text{ errors}) = \binom{n}{m} p_e^m (1-p_e)^{(n-m)} \quad (1)$$

Where $p_e$ is the probability of a single bit being read in error. Thus, the probability that a T error-correcting constituent code is length-n is able to correct is given by, $$Pr(m \leq T \text{ errors}) = \sum_{m=0}^{T} \binom{n}{m} p_e^m (1-p_e)^{(n-m)} \quad (2)$$

When there are more than T bit-errors, either the decoding attempt will be undecodable, or a miscorrection will occur. To analyze this scenario, consider the depiction of a constituent code shown in conjunction with FIG. 2.

FIG. 5 is an example diagram depicting a bounded distance (T error-correcting) error-control code as spheres of radius T in n-dimensional binary space. Here, the outer circle depicts the set of all $2^n$ length-n vectors (denoted as $V^n$ and each of the $2^k$ codewords is depicted as an X. Since this is a T error-correcting code, there exist non-overlapping spheres of radius T surrounding each codeword and, when a received decision sequence (e.g., hard-decision sequence) falls within a sphere, a decoder will correct to the codeword at its center. If there are more than T bit-errors, then the received sequence falls outside of the sphere centered at the written codeword. If the received sequence falls within another sphere then it will miscorrect, and if the received sequence falls outside of all other spheres then it will be undecodable.

To analyze the case of >T bit-errors, first assume that, given that a received sequence falls outside of the sphere centered at its written codeword (the original/intended codeword that was transmitted that, due to bit-errors, became the received sequence), that it falls arbitrarily into the remainder of the space (in practice, the received sequence may not fall arbitrarily, as the received sequence may depend on the probability of error each bit). There are $(2^k-1)$ disjoint spheres outside of the sphere centered at the written codeword and, thus, the number of vectors lying exactly r bit-flips away from the center of any of these spheres is given by, $$N_r = (2^k - 1) \times \binom{n}{r} \quad (3)$$

Given that more than T bit-errors are contained in the received sequence, and that the received sequence falls inside of a sphere (if the received sequence falls outside of any sphere, then the codeword is undecodable and the receiver makes no corrections), the probability that r bits will be flipped by the miscorrection is given by, $$Pr(r \text{ bit flips}) \approx \binom{n}{r} / \sum_{i=0}^{T} \binom{n}{i} \quad (4)$$

where (4) is approximate as it has been assumed that the received sequence falls arbitrarily outside of the sphere centered at the written codeword (i.e., does not follow the channel probability). This value is provided for the (n,k,T)=(1022,992,3) BCH Code over GF $(2^{10})$ given as an example above in conjunction with FIGS. 1A and 1B.

The following table provides example (approximate) probabilities of flipping r bits when miscorrecting a (n,k,T)=(1022,992,3) BCH Code.

TABLE 1

| r | ≈ Pr (r bit flips) |
|---|---|
| 0 | 5.6208e−009 |
| 1 | 5.7444e−006 |
| 2 | 2.9325e−003 |
| 3 | 9.9706e−001 |

To obtain more exact values (corresponding to the probability distribution dictated by channel statistics) for the approximations provided in Table 1, the code can be simulated over a binary symmetric channel, the results of which are provided in conjunction with FIG. 4.

FIG. 6 is a diagram illustrating an example probability of 0, 1, 2, and 3 bits flipping during a miscorrection for the (n,k,T)=(1022,992,3) BCH Code over GF $(2^{10})$. In his diagram, the approximations provided in Table 1 are shown in dashed lines (shown at 602, 604, 606, and 608). As predicted by (4), in the case of a miscorrection, the overwhelming majority of sequences will miscorrect to a codeword which is T bit-errors away from the received sequence. Although the probability is relatively insensitive to the value of $p_e$, as shown, the simulated probabilities asymptotically approach the approximations given in Table 1 since assumption of a random position in the space outside of the written codeword sphere becomes more valid with increasing error-rate.

In light of the above discussion and analysis, the decoding procedure using miscorrection detection described above (e.g., in conjunction with process 300 of FIG. 3 and process 400 of FIG. 4) can be utilized to reduce the probability of miscorrection, and, for example, decoding of turbo product codes using miscorrection detection can be performed.

FIG. 7 is a diagram illustrating example sector failure rates (SFR) for a native 4 kB BCH Code, a TPC utilizing a (n,k,T)=(1022,992,3) constituent BCH Code over GF ($2^{10}$) utilizing a traditional decoding methodology, and the same TPC decoding using miscorrection detection. The performance achievable using the decoding using miscorrection detection as compared to a traditional decoding methodology/technique that flips bits during any successful constituent decoding is shown. As shown, at a channel bit error rate (BER) of 3.5e-3 (702), there is an 8× improvement of sector failure rate using decoding using miscorrection detection (704) over that achieved using traditional decoding (706).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
an error correction decoder; and
a miscorrection detector;
the error correction decoder configured to:
determine a number of bit-flips required to correct errors in one or more of a plurality of read values, wherein the plurality of read values correspond to a codeword; and
send the determined number of bit-flips to the miscorrection detector;
and
the miscorrection detector configured to:
receive from the error correction decoder the number of bit-flips required to correct the errors in the one or more of the plurality of read values;
determine whether the number of bit-flips required to correct the errors is a permitted number of bit-flips; and
send an indication to the error correction decoder to apply the bit-flips required to correct the errors when the number of bit-flips required to correct the errors is determined to be a permitted number of bit-flips.

2. The system recited in claim 1, wherein the codeword comprises a constituent codeword of a Turbo Product Code.

3. The system recited in claim 2, wherein the constituent codeword is a BCH code.

4. The system recited in claim 1, wherein the permitted number of bit-flips is relative to the error correction capability of the error correction decoder.

5. The system recited in claim 1, wherein the error correction decoder is further configured to apply the number of bit-flips to the codeword in response to the sent indication.

6. The system recited in claim 5, wherein the miscorrection detector is further configured to:
receive a second number of bit-flips required to correct errors in a second plurality of read values corresponding to a second codeword, wherein the second number of bit-flips is greater than a previous number of bit-flips;
determine whether the second number of bit-flips is a permitted number of bit-flips; and
send a second indication to the error correction decoder that the second number of bit-flips is permitted when the second number of bit-flips is determined to be a permitted number of bit-flips.

7. The system recited in claim 1, wherein when the miscorrection detector determines that the number of bit-flips is not a permitted number of bit-flips, the miscorrection detector is further configured to send an indication the number of bit-flips should not be applied to the codeword.

8. The system recited in claim 1, wherein the permitted number of bit-flips is dynamically adjusted.

9. The system of claim 1, wherein the permitted number of bit-flips is determined based on a probability of flipping a number of bits when a codeword is miscorrected.

10. A method, comprising:
determining, by an error correction decoder, a number of bit-flips required to correct errors in one or more of a plurality of read values, wherein the plurality of read values correspond to a codeword;
sending the determined number of bit-flips to a miscorrection detector;
receiving, by the miscorrection detector, the number of bit-flips required to correct the errors in the one or more of the plurality of read values;
determining whether the number of bit-flips required to correct the errors is a permitted number of bit-flips; and
sending an indication to the error correction decoder to apply the bit-flips required to correct the errors when the number of bit-flips required to correct the errors is determined to be a permitted number of bit-flip.

11. The method of claim 10, wherein the codeword comprises a constituent codeword of a Turbo Product Code.

12. The method of claim 11, wherein the constituent codeword is a BCH code.

13. The method of claim 10, wherein the permitted number of bit-flips is relative to the error correction capability of the error correction decoder.

14. The method of claim 10, further comprising applying, by the error correction decoder, the bit-flips to the codeword in response to the sent indication.

15. The method of claim 14, further comprising:
receiving, by the miscorrection detector, a second number of bit-flips required to correct errors in a second plurality of read values corresponding to a second codeword, wherein the second number of bit-flips is greater than the a previous number of bit-flips;
determining, by the miscorrection detector, whether the second number of bit-flips is a permitted number of bit-flips; and
sending, by the miscorrection decoder, a second indication that the second number of bit-flips is permitted when the second number of bit-flips is determined to be a permitted number of bit-flips.

16. The method of claim 10, wherein when the miscorrection detector determines that the number of bit-flips is not a permitted number of bit-flips, sending an indication that the number of bit-flips should not be applied to the codeword.

17. The method of claim 10, wherein the permitted number of bit-flips is dynamically adjusted.

18. The method of claim 10, wherein the permitted number of bit-flips is determined based on a probability of flipping a number of bits when a codeword is miscorrected.

* * * * *